United States Patent [19]

Hirabayashi et al.

[11] 4,084,881
[45] Apr. 18, 1978

[54] LIGHT BEAM SCANNING DEVICE

[75] Inventors: Yoichi Hirabayashi, Tokyo; Setsuo Minami, Yokohama; Takeshi Goshima, Tokyo, all of Japan

[73] Assignee: Canon Kabushiki Kaisha, Tokyo, Japan

[21] Appl. No.: 732,408

[22] Filed: Oct. 14, 1976

[51] Int. Cl.[2] .............................................. G02B 27/17
[52] U.S. Cl. ........................ 350/6.8; 350/182; 358/199
[58] Field of Search ................ 350/7, 6, 182; 358/199

[56] References Cited

U.S. PATENT DOCUMENTS 3,814,945  6/1974  Allnutt et al. ........................ 350/182

FOREIGN PATENT DOCUMENTS 2,517,821  10/1975  Germany ................................ 350/7

*Primary Examiner*—John K. Corbin
*Assistant Examiner*—B.W. delos Reyes
*Attorney, Agent, or Firm*—Fitzpatrick, Cella, Harper & Scinto

[57] ABSTRACT

A prism anamorphic optical system is disposed in the path of deflected beam from a rotatable polygonal mirror or a galvano-mirror. This prism anamorphic optical system includes at least two prisms, so that different amounts of displacement of the deflected beam at each angle of deflection and in a direction perpendicular to the direction of deflection caused by the first of the prisms are corrected by the second and subsequent prisms, as viewed from the incidence side. Thus, a straight scanning line may be obtained.

3 Claims, 27 Drawing Figures $\beta=4 \quad u'_k=4.944°$ $\beta=4 \quad u'_k=4.8475°$ $\beta=4 \quad u'_k=4.6453°$ $\beta=4 \quad u'_k=5.1793°$ $\beta=4 \quad u'_k=5.4391°$

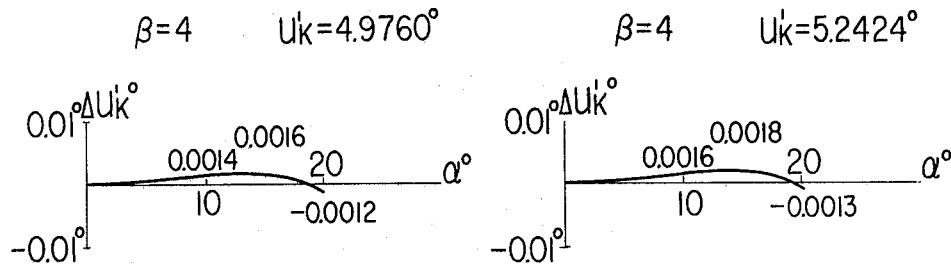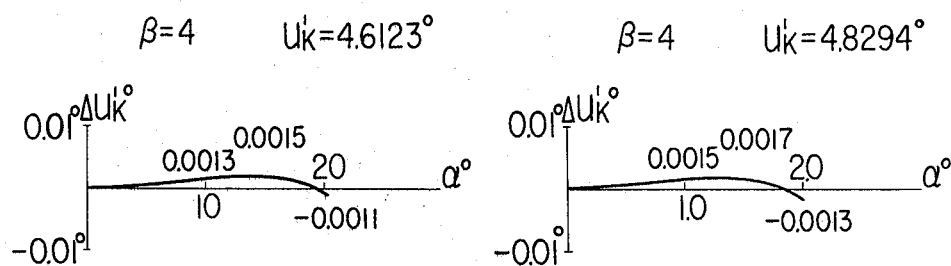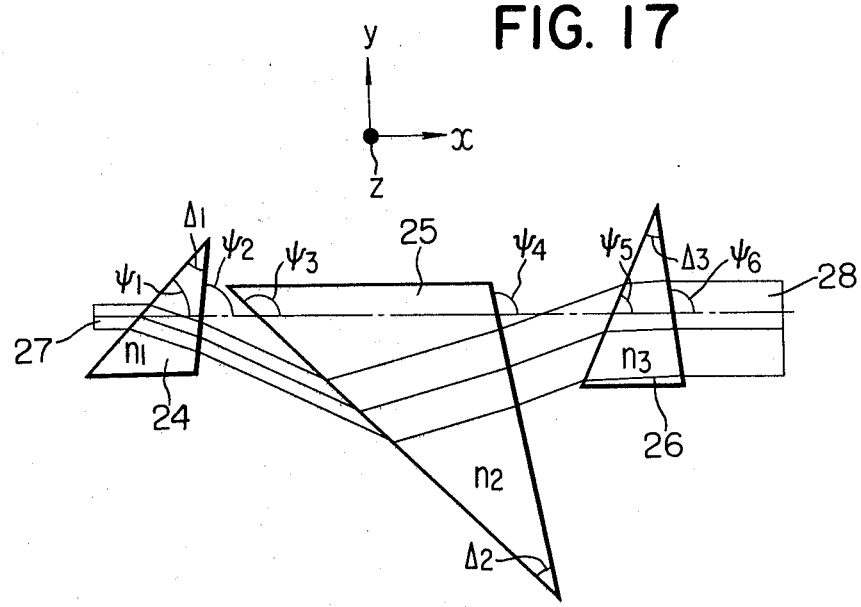

$\beta=4$   $u'_k=0.005°$ $\beta=4$   $u'_k=-0.051°$ $\beta=4$   $u'_k=0.7281°$ $\beta=4$   $u'_k=0.0000°$ $\beta=4$   $u'_k=-0.0011°$ $\beta=4$   $u'_k=0.0000°$ $\beta=4 \quad u'_k=-0.0000°$ $\beta=4 \quad u'_k=-0.0000°$ $\beta=4 \quad u'_k=0.0000°$ $\beta=4 \quad u'_k=-0.0000°$

LIGHT BEAM SCANNING DEVICE

BACKGROUND OF THE INVENTION a. Field of the Invention

This invention relates to a light beam scanning device.

b. Description of the Prior Art

A light beam scanning device in which a light beam is caused to impinge on a deflecting mirror such as rotatable polygonal mirror or galvano-mirror to thereby provide a deflected beam has been used in such an apparatus as image original reader apparatus or laser beam printer apparatus. In the light beam scanning device used in such apparatus, it is desirable that the scanning line depicted on a scanned surface by the deflected beam be coincident with a predetermined scanning line on the scanned surface. More particularly, the light beam scanning device is desired in which the deflected beam will not move on a line different from the predetermined line on the scanned surface. Such a phenomenon of the deflected beam which moves out of alignment with the predetermined line on the scanned surface occurs in such cases where, for example, the rotatable polygonal mirror is not disposed with the deflecting mirror surfaces thereof parallel to the rotary shaft thereof or where the rotary shaft is not mounted with sufficient accuracy. Therefore, in order to prevent occurrence of such phenomenon, the rotatable polygonal mirror or the galvano-mirror should be manufactured with extreme accuracy, but with the cost or other problem in view, it is difficult to manufacture the rotatable polygonal mirror or the galvano-mirror with sufficient accuracy and if such mirror could at all be manufactured with sufficient accuracy, it would be very difficult to maintain the accuracy for a long time.

For this reason, various scanning devices have heretofore been proposed which have succeeded in preventing or reducing the occurrence of the above-noted phenomenon.

For example, U.S. Pat. No. 3,750,189 discloses a scanning optical system which prevents occurrence of such phenomenon by skilful use of a cylindrical lens. Also, our U.S. Application Ser. No. 569,608 and German Pat. application P 25 17 821.6 disclose a scanning optical system including an anamorphic optical system disposed in the path of the deflected beam, the anamorphic optical system being effective only in a direction perpendicular to the direction of deflection of the deflected beam, thereby reducing occurrence of the aforementioned phenomenon.

The present invention relates to an improvement in the scanning optical system covered by our prior applications.

The improvement lies in that occurrence of the nonlinear scanning line which would otherwise result from the use of a prism anamorphic optical system as the anamorphic optical system, namely, distortion or deflection of the scanning line, may be prevented or reduced. The above-noted phenomenon of the deflected beam which moves on a line different from a predetermined line (hereinafter, this phenomenon will be referred to as "tilt" and the prevention or reduction of such phenomenon will be called "correction of the tilt") may be reduced in its possibility of occurrence by the use of a prism anamorphic optical system, but due to the optical characteristic of the prism forming the prism anamorphic optical system, the deflected beam is displaced in a direction perpendicular to the direction of deflection by different amounts, depending on the position whereat the angle of deflection lies, so that distortion or deflection occurs to the scanning line.

SUMMARY OF THE INVENTION

It is therefore an object of the present invention to provide a light beam scanning device using a prism anamorphic optical system which may provide a straight scanning line.

Such object may be achieved by forming the prism anamorphic optical system by at least two prisms and using the second and subsequent ones of the prisms to correct the displacement of the deflected beam in the direction perpendicular to the direction of deflection and at each angle of deflection caused by the first of the prisms, as viewed from the incidence side.

According to the present invention, the light beam scanning device comprises a source of light, a deflecting mirror for causing a light beam from the source to be deflected about an axis toward which the light beam is directed, a prism anamorphic afocal optical system for the correction of tilt disposed in the path of the deflected beam from the deflecting mirror, the prism anamorphic afocal optical system comprising a plurality of prisms so that different displacements of the deflected beam at each angle of deflection and in a direction perpendicular to the direction of deflection caused by the first of the prisms are corrected by the second and subsequent prisms, as viewed from the incidence side, and a condensing optical system disposed between the prism anamorphic afocal system and a surface to be scanned, to thereby cause the deflected beam from the prism anamorphic afocal optical system to be condensed on the surface to be scanned.

The prism anamorphic afocal optical system may be such that the angle formed between the standard deflection plane of the deflected beam emergent from the prism anamorphic afocal optical system and the actual deflected beam is 0.00997 or less. Alternatively, the prism anamorphic afocal optical system may be such that the angle formed between the principal ray in the deflected beam incident on the prism anamorphic afocal optical system and the principal flux in the deflected beam emergent from the prism anamorphic afocal optical system is 0.051 or less.

The invention will become more fully apparent from the following detailed description thereof taken in conjunction with the accompanying drawings.

BRIEF DESCRIPTION OF THE DRAWINGS

FIGS. 8 to 16 illustrate the characteristics at the emergence side of various examples of the anamorphic afocal prism optical system comprising two prisms which is used in the present invention.

FIG. 17 shows an anamorphic afocal prism optical system comprising three prisms.

DESCRIPTION OF THE PREFERRED EMBODIMENTS

Figure 1:
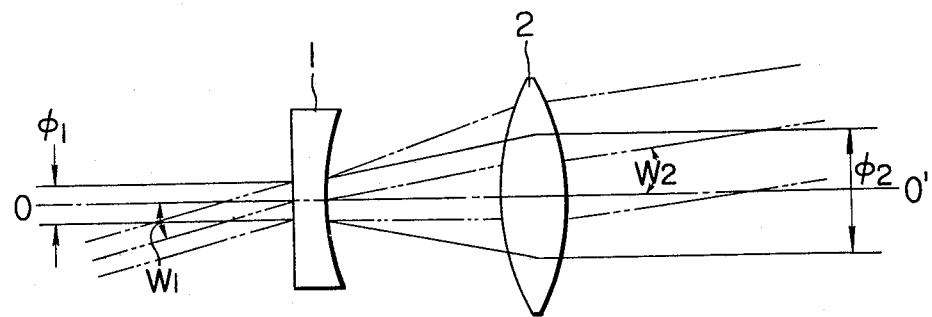
FIG. 1 is a schematic view showing an anamorphic optical system.

Referring to FIG. 1, it schematically shows an example of the afocal anamorphic optical system comprising a concave lens 1 and a convex lens 2. Let $\phi_1$ be the diameter of a beam incident on the afocal optical system and $\phi_2$ be the diameter of the beam emergent from the afocal optical system ($\phi_1 > \phi_2$). As is well-known, the angle $W_2$ formed by the emergent beam with the optical axis 0–0' when the incident beam is inclined by an angle $W_1$ with respect to the optical axis 0–0' is in the following relation:

$$(W_2/W_1) = (\phi_1/\phi_2) \quad (1)$$

angle As is apparent from equation (1) the physical quantity which is the product of the beam width $\phi$ and the agle of inclination W before or after the afocal optical system is constant, so that any increase in the beam diameter results in a decrease in the angle of inclination. Therefore, correction of the "tilt" may be accomplished by arranging such a cylindrical anamorphic optical system between a deflecting mirror and a surface to be scanned so that the direction of its bus line may be the direction of deflection and that the incident beam may emerge while being expanded.

Known as similar to such cylindrical anamorphic optical system is the prism anamorphic afocal optical system using a single prism. This prism anamorphic optical system is economically advantageous in that it employs a prism as component.

However, where the prism anamorphic optical system has been used for the correction of the "tilt," the deflected beam emergent from the prism has presented different amounts of displacement at each angle of deflection and in the direction perpendicular to the direction of deflection, due to the characteristic of the prism, as already noted, and this has sometimes resulted in a distorted scanning line on the scanned surface and accordingly, failure to obtain a straight scanning line.

Figure 2:
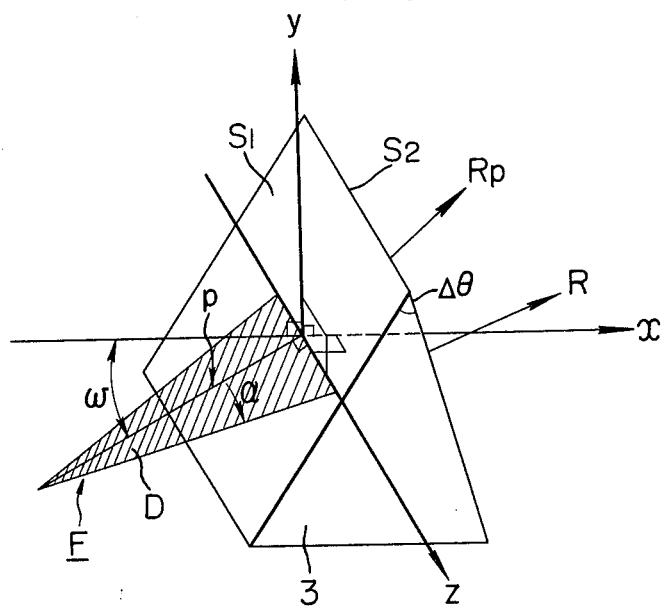
FIGS. 2, 3 and 4 illustrate the manner in which the deflected parallel beam incident on a prism anamorphic optical system comprising a single prism is displaced at each angle of deflection and in a direction perpendicular to the direction of deflection.
Figure 3:
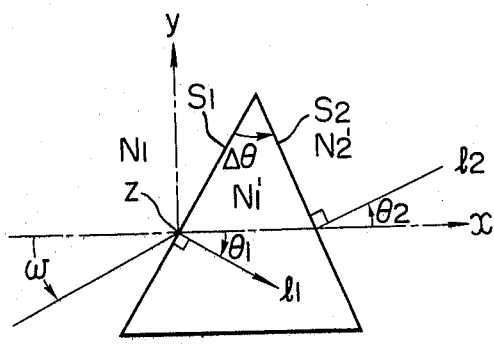
Figure 4:
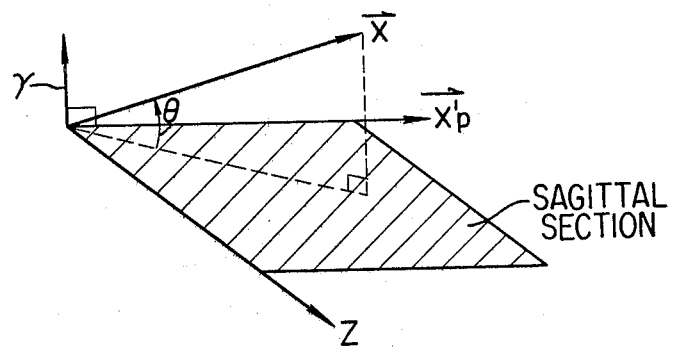

Reference will now be had to FIGS. 2 through 4 to describe the planarity with which a deflected beam incident on a prism anamorphic optical system comprising a single prism is emergent from such optical system in its plane of deflection. In the ensuing description, it is to be understood that a sheet-like beam flux comprising a number of deflected beams is used instead of a single deflected beam.

FIG. 2 is a perspective view for illustrating the positional relation between the prism and the beam flux incident thereon, and FIG. 3 is a view of the FIG. 2 prism as seen from the positive direction of z-axis thereof. The prism 3 has two inclined flat surfaces S1 and S2, namely, a first surface S1 on which light is incident and a second surface S2 from which light is emergent.

These two flat surfaces S1 and S2 are inclined in $x$–$y$ plane and the origin of the coordinate system is disposed on the surface S1, for the sake of convenience. Thus, the first surface S1 is a plane containing the z-axis.

Suppose that $\theta_1$ is the angle formed between the normal $l_1$ to the first surface S1 and the x-axis and that $\epsilon_1 = (\epsilon_{1x}, \epsilon_{1y}, \epsilon_{1z})$ is the unit vector of the normal to the first surface. Then, $$\epsilon_{1x} = \cos \theta_1$$
$$\epsilon_{1y} = \sin \theta_1$$
$$\epsilon_{1z} = 0$$

Also suppose that $\theta_2$ is the angle formed between the normal $l_2$ to the second surface S2 and the z-axis and that $\epsilon_2 = (\epsilon_{2x}, \epsilon_{2y}, \epsilon_{2z})$ is the unit vector of the normal to the second surface. Then, $$\epsilon_{2x} = \cos \theta_2$$
$$\epsilon_{2y} = \sin \theta_2$$
$$\epsilon_{2z} = 0$$

$\Delta\theta$ is the vertical angle of the prism and may be expressed as $\Delta\theta = \theta_2 - \theta_1$, where $\theta_1$ and $\theta_2$ are such that their values measured counter-clockwisely from the x-axis are of positive sign and their values measured clockwisely from the x-axis are of negative sign. Thus, the positive sign of $\Delta\theta$ refers to the case where the prism is disposed with its vertical angle facing in the positive direction of the y-axis and the negative sign of $\Delta\theta$ refers to the converse case.

The refractive indices of the mediums are: $N_1$ for the air space at the incidence side, $N_2$ for the interior of the prism and $N_2'$ for the air space at the emergence side. In practice, the prism is disposed in a uniform medium and so, $N_1$ may be regarded as equal to $N_2'$, but for the purpose of general consideration, it is assumed that the medium at the incidence side and the medium at the emergence side differ from each other.

A triangular planar beam flux D perpendicular to the $x$-$y$ plane and along the z-axis is incident on the prism 1. When this occurs, the principal ray P lies in the $x$-$y$ plane and forms an angle $\omega$ (shown as positive) with the x-axis. An angle $\alpha$ (shown as positive) is formed between the principal ray P and an arbitrary incident ray F, and as will be apparent from what has been described above, it is to be understood that the arbitrary incident ray F lies in a plane containing the principal ray P and the z-axis. Assume that the direction cosine of the principal ray P is $\vec{X}_p = (X_p, Y_p, Z_p)$. Then, $$X_p = \cos\omega$$
$$Y_p = \sin\omega$$
$$Z_p = 0$$

Assume that the direction cosine of the arbitrary incident ray is $= (\vec{X}, Y, Z)$. Then, $$X = \cos\omega \cos\alpha$$
$$Y = \sin\omega \cos\alpha$$
$$Z = \sin\alpha$$

Next, assume that the direction cosine of the principal ray $R_p$ passed through the prism 3 is $\vec{X}'_p = (X'_p, Y'_p, Z'_p)$ and that the direction cosine of an arbitrary ray R after emerging from the prism is $\vec{X}' = (X', Y', Z')$. From Snell's law, $\vec{X}'$ is given by the following equations, in which expression is made directly by the use of the parameters at the incidence side $(\omega,\alpha)$ for convenience of the ensuing analysis, although it is complicated.

$$X' = -\frac{N'_1}{N'_2} \eta_2 \sin\theta_2 + \xi'_2 \cos\theta_2$$

$$Y' = \frac{N'_1}{N'_2} \eta_2 \cos\theta_2 + \xi'_2 \sin\theta_2$$

$$Z' = \frac{N_1}{N'_2} \sin\alpha$$

However, $$\xi_1 = \cos(\omega - \theta_1) \cos\alpha$$

$$\xi'_1 = \sqrt{1 - (\frac{N_1}{N'_1})^2 (1 - \xi_1^2)}$$

$$\xi_2 = \frac{N_1}{N'_1} \cos\alpha \sin(\omega - \theta_1) \sin\Delta\theta + \xi'_1 \cos\Delta\theta$$

$$\eta_2 = \frac{N_1}{N'_1} \cos\alpha \sin(\omega - \theta_1) \cos\Delta\theta - \xi'_1 \sin\Delta\theta$$

$$\xi'_2 = \sqrt{1 - (\frac{N'_1}{N'_2})^2 (1 - \text{to } \xi_2^2)}$$

Consideration will now be given to what change will occur to the planarity of the rectangular planar beam flux incident on the prism 3 after it has emerged from the prism. As the standard for studying the planarity of the rectangular planar beam flux after having emerged from the prism, consideration will first be given to the amount of angle ⊕ between the sagittal section in the air space at the emergence side, namely, the section containing the emergent principal ray and perpendicular to the x-y plane and the direction cosine X' of an arbitrary ray at the emergence side, that is sin ⊕, as shown in FIG. 4.

If use is made of the unit vector of the normal to the sagittal section, namely, $\gamma = (-y'_p, X'_p, 0)$, sin ⊕ may be given by the following equation:

$$\sin H = (\vec{X} \cdot \gamma) = (\frac{N'_1}{N'_2})\{\eta_2 \xi'_{2p} - \eta_{2p} \xi'_2\} \text{ where} \quad (2)$$

$$\begin{cases} \xi'_{2p} \equiv (\xi'_2)\alpha = 0 \\ \eta_{2p} \equiv (\eta_2)\alpha = 0 \end{cases}$$

In order to derive the conditions required for an arbitrary ray emergent from a prism to be contained in the sagittal section at the emergence side, namely, for the beam (2), at the emergence side to maintain its planarity, it is only necessary to study the conditions which will satisfy sin ⊕ = 0. From equation (2), this may be accomplished by solving the following equation:

$$\eta_2 \xi'_{2p} - \eta_{2p} \xi'_2 = 0 \quad (3)$$

By squaring equaring equation (3) and substituting $\xi_{2p}$ and $\xi_2$ for $\xi'_{2p}$ and $\xi'_2$, this equation may be rearranged as follows:

$$\eta_2^2 - \eta_{2p}^2 \cdot (\frac{N'_1}{N'_2})^2 [(\eta_{2p}^2 \xi_2^2 - \eta_2^2 \xi_{2p}^2) + (\eta_2^2 - \eta_{2p}^2)] \quad (4)$$

Equation (4) is complicated to obtain its general solution and therefore, practical conditions for the refractive indices, namely, a case where a prism of refractive index N' is disposed in an air space of refractive index N, must be taken into consideration.

(4) under the conditions that $N'_2 = N_1 = N$ and $N'_1 = N'$, equation (4) may be rearranged into:

$$\begin{bmatrix} A \sin\Delta\theta = B \sin\Delta\theta \{\xi'_1 - \xi'_{1p} \cos\alpha\} \text{ where} \\ A \equiv \left(1 - (\frac{N}{N'})^2\right) \sin^2\alpha \sin\Delta\theta \\ B \equiv 2(\frac{N}{N'}) \cos\Delta \sin(\omega - \theta_1) \cos\Delta\theta \end{bmatrix} \quad (5)$$

If equation (4) is squared, deformed and squared to open the radical signs of $\xi'_1$ and $\xi'_{1p}$, equation (6) will be obtained as follows:

$$\left\{1 - (\frac{N}{N'})^2\right\} X \sin^4\alpha \, X \sin^4\Delta\theta \, X \Bigg[ \Bigg\{ \Bigg(1 - (\frac{N}{N'})^2\Bigg) \sin^2\alpha \sin^2\Delta\theta + 4(\frac{N}{N'})^2 \cos^2\alpha \sin^2(\omega - \theta_1) \cos^2\Delta\theta \Bigg\}^2 - \Bigg\{4(\frac{N}{N'}) \cos\alpha \sin(\omega - \theta_1)\Bigg\}^2 \Bigg[ \Bigg\{1 - (\frac{N}{N'})^2\Bigg\} + (\frac{N}{N'})^2 \cos^2\alpha \cos^2(\omega - \theta_1) \Bigg] \sin^2\Delta\theta \cos^2\Delta\theta \Bigg) = 0 \quad (6)$$

From equation (6), there are obtained the following solutions (I) to (V).

(I) $1 - (\frac{N}{N'})^2 = 0$    Hence, $N' = N$
(II) $\sin\alpha = 0$    Hence, $\alpha = 0$ ( $|\alpha| < 90°$)
(III) $\sin\Delta\theta = 0$    Hence, $\Delta\theta = 0$ ( $|\Delta\theta| \leq 90°$)
Also, by substituting 0 for the braces,
$$\cos^4\Delta\theta \, X \, [\{a \tan^2\Delta\theta + b^2\}^2 - 4b^2 c \, X \tan^2\Delta\theta] = 0 \quad (7)$$

where $a \equiv \left(1 - (\frac{N}{N'})^2\right) \sin^2\alpha \neq 0$ $b \equiv 2(\frac{N}{N'}) \cos\alpha \sin(\omega - \theta_1)$ $c \equiv \left(1 - (\frac{N}{N'})^2\right) + (\frac{N}{N'})^2 \cos^2\alpha \cos^2(\omega - \theta_1)$ By solving equation (7),
(IV) $\cos\Delta\theta = 0$    Hence, $\Delta\theta = \pm 90°$ (V) $$\tan\Delta\theta = \pm \frac{b}{a}\left(\sqrt{c} \pm \sqrt{c - a}\right) \quad (8)$$

where $c - a = \cos^2\alpha\left(1 - (\frac{N}{N'})^2 \sin^2(\omega - \theta_1)\right)$ The reason why only the case where $a \neq 0$ is considered in equation (6) is that if $a = 0$, the equation will resolve itself into solutions (I) and (II).

As to whether solutions (I) to (V) satisfy the condition that sin ⊕ = 0, it is necessary to substitute each of the solutions for the right side of equation (1) and examine it. This is because some irrelevant solutions might result from the squaring having been effected in the course of obtaining the solutions. Thus, by substituting solutions (I) to (V) for equation (1), these solutions must be checked and their physical meaning must be considered.

Solution (I), i.e. N = N′, satisfies sin ⊕ = 0, but the physical meaning of this solution is propagation of the beam flux through a simple air space in which no prism is present. Therefore, this solution is meaningless.

Solution (II), i.e. $\alpha = 0$, satisfies sin ⊕ = 0, but the physical meaning of this solution is propagation of the principal ray. Thus, this solution is also meaningless.

Solution (III), i.e. $\Delta\theta = 0$, satisfies sin ⊕ = 0, but the physical meaning of this solution is that the vertical angle of the prism is zero. This suggests a parallel-sided flat glass plate instead of a prism and therefore, this solution is also excluded.

It is readily seen that solution (IV), i.e. $\Delta\theta = \pm 90°$, is an irrelevant solution. The reason is this: what should satisfy sin ⊕ = 0 should also satisfy equation (5) which has resulted from the squaring thereof, whereas substitution of $\Delta\theta = \pm 90°$ for equation (5) obtains B=0 from cos $\Delta\theta$; on the other hand, since sin $\Delta\theta \neq 0$, equation (5) holds true only when A = 0 and such case results in solutions (I) and (II). It is thus seen that solution (IV) is not generally the solution where N ≠ N ′ and $\alpha = 0$.

Solution (V) is the form in which $\Delta\theta$ is solved, but whether or not these four solutions satisfy sin ⊕ = 0 cannot easily be seen. To inspect this solution, an example of numerical values will herein be taken. If sin ⊕ ≠ 0 could be found by doing so, it will be seen that solution (V) is an irrelevant solution. This is because, if solution (V) were a right mathematical general solution, any example of numerical values should satisfy sin ⊕ = 0.

By substituting N = 1, N′ = 1.7, $\omega = 0°$, $\alpha = 17°$ and $\theta_1 = -30°$ for equation (8) and solving this equation, the vertical angle $\Delta\theta$ of the prism will be found as:

$$\Delta\theta = \pm 16.843°, \Delta\theta = \pm 86.939°$$

Thus, if the above numerical values and the values of $\Delta\theta$ are substituted for equation (2), the following will be obtained:

| $\Delta\theta$ (degrees) | sin⊕/N′ |
|---|---|
| 16.843° | 0.01355 |
| −16.843° | 0.00893 |
| 86.939° | 0.00896 |
| −86.939° | −0.00737 |

Hence, sin ⊕ = 0 and it is thus seen that solution (V) is also an irrelevant solution.

It follows from these analyses that the rectangular beam flux D impinging on a single prism cannot have its emergent beam flux formed into a planar beam flux whatever shape the prism may assume.

It has thus been found in the prism anamorphic optical system comprising a single prism that even if the deflected beam incident on the prism has planarity, the deflected beam emergent from the prism has no planarity. To compensate for such non-planarity created in the prism anamorphic optical system to thereby maintain the planarity of the scanning beam, it is necessary that the prism anamorphic optical system to be formed by a plurality of prisms and an amount of non-planarity of the opposite sign to the amount of non-planarity created by the prism system subsequent to the first prism. Therefore, the afocal anamorphic optical system comprising a plurality of prisms will hereinafter be analysed.

Figure 7:
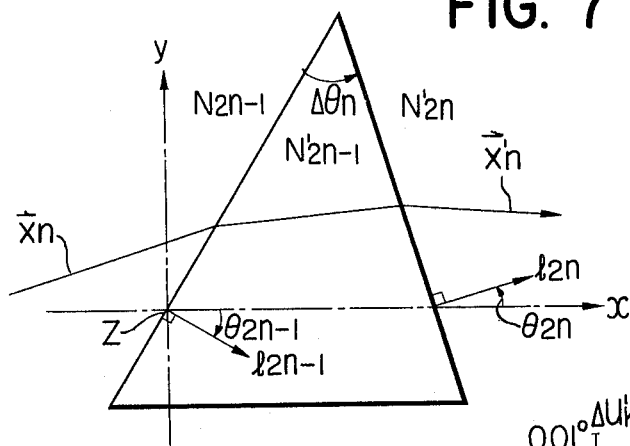
FIG. 7 illustrates the relation between the deflected beam incident on the $n$th prism of the prism anamorphic optical system comprising a plurality of prisms and the deflected beam emergent from said prism.
Figure 8:
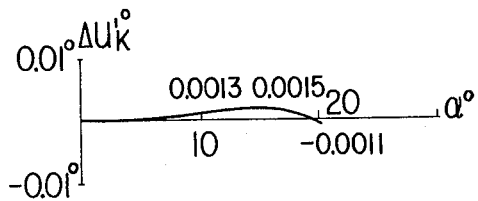
Figure 9:
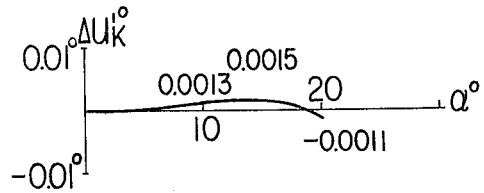
Figure 10:
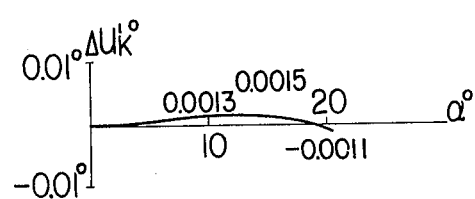
Figure 11:
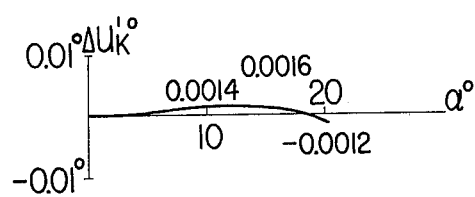
Figure 12:
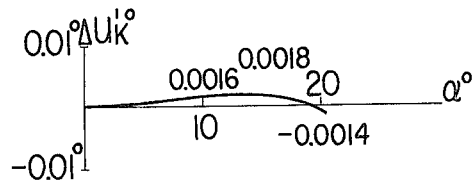
Figure 18:
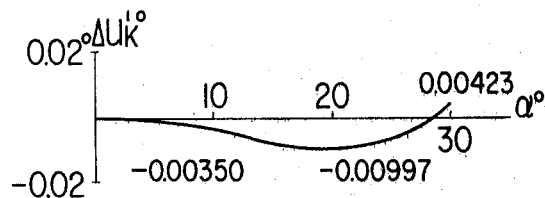
FIGS. 18 to 27 illustrate the characteristics at the emergence side of various examples of the anamorphic afocal prism optical system comprising three prisms which is used in the present invention.
Figure 21:
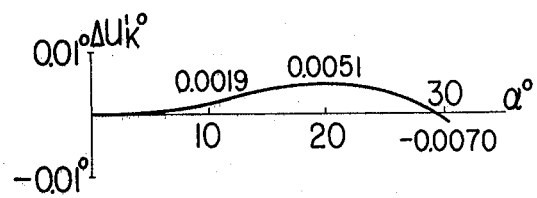
Figure 19:
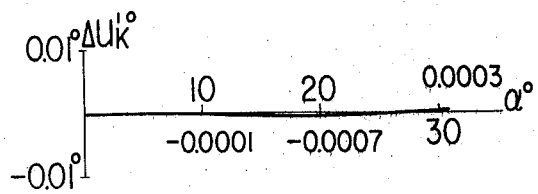
Figure 22:
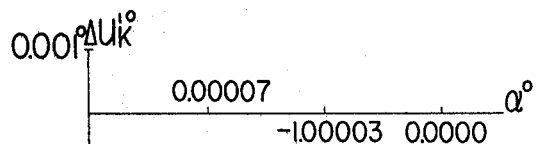
Figure 20:
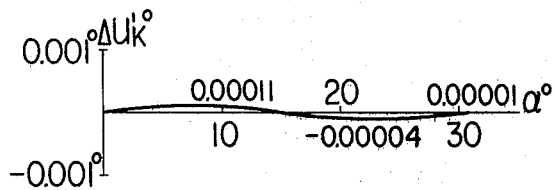
Figure 23:
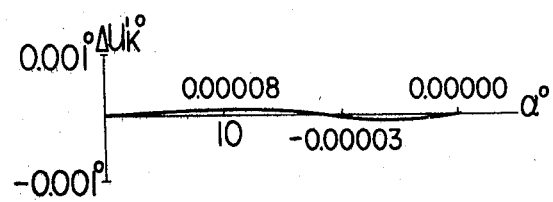
Figure 24:
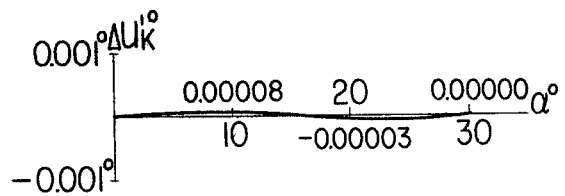
Figure 25:
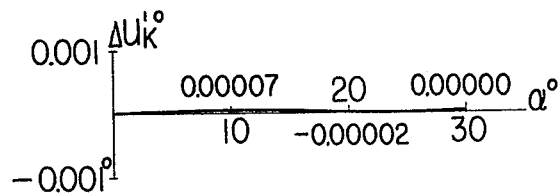
Figure 26:
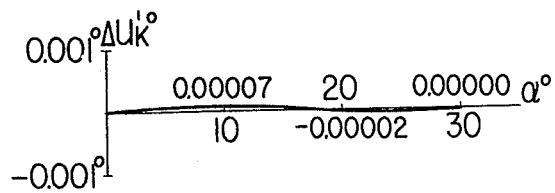
Figure 27:
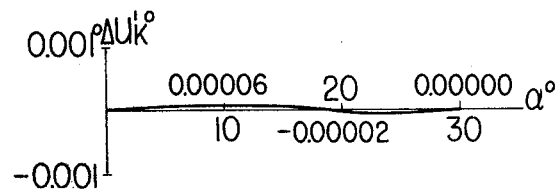

FIG. 7 illustrates the state of the scanning beam in the nth prism in an afocal anamorphic optical system comprising R prisms, as counted in the direction of incidence of the scanning beam. The prism shown in FIG. 7, like the prism shown in FIG. 3, is such that the prism surfaces through which the scanning beam passes are inclined only in the x-y plane and the origin of the coordinates is provided on the incidence surface of the prism. Further, the amounts of data are given the signs in the same manner as shown in FIG. 3.

The relation between the direction cosine $\vec{X}n = (XN, Yn, Zn)$ of an arbitrary ray incident on the nth prism and the direction cosine $\vec{X'}n = (X'n, Y'n, Z'n)$ of this ray when emerging from the prism may be obtained as the following equation by intactly using the above-described relation in the single prism.

$$\left. \begin{array}{l} X'n = -\left(\dfrac{N'_{2n-1}}{N'_{2n}}\right)\eta_{2n}\sin\theta_{2n} + \xi'_{2n}\cos\theta_{2n} \\ Y'n = \left(\dfrac{N'_{2n-1}}{N'_{2n}}\right)\eta_{2n}\cos\theta_{2n} + \xi'_{2n}\sin\theta_{2n} \\ Z'n = \left(\dfrac{N'_{2n-1}}{N'_{2n}}\right)\sin\alpha_n \end{array} \right\} \quad (101)$$

where $$\left. \begin{array}{l} \xi_{2n-1} = \cos(\omega_n - \theta_{2n-1})\cos\alpha_n \\ \xi'_{2n-1} = \sqrt{1 - \left(\dfrac{N_{2n-1}}{N'_{2n-1}}\right)^2(1-\xi^2_{2n-1})} \\ \xi_{2n} = \dfrac{N_{2n-1}}{N'_{2n-1}}\cos\alpha_n\sin(\omega_n - \theta_{2n-1})\sin\Delta\theta_n + \xi'_{2n-1}\cos\Delta\theta_n \\ \eta_{2n} = \dfrac{N_{2n-1}}{N'_{2n-1}}\cos\alpha_n\sin(\omega_n - \eta_{2n-1})\cos\Delta\theta_n \\ \xi'_{2n-1}\sin\Delta\theta_n - \sqrt{\left(\dfrac{N_{2n-1}}{N'_{2n}}\right)(1-\xi^2_{2n})} \end{array} \right\} \quad (102)$$

where $\omega_n$ is the angle formed between the projection ray resulting from the incident ray being projected upon the x-y plane and the z-axis, $\alpha_n$ is the angle formed between the incident ray and the projection ray resulting from the incident ray being projected upon the x-y plane. Thus, $\omega_n$ and $\alpha_n$ have the following relations with the direction cosine $\vec{X}n$ of the incident ray.

$$\left. \begin{array}{l} Xn = \cos\omega_n\cos\alpha_n \\ Yn = \sin\omega_n\cos\alpha_n \\ Zn = \sin\alpha_n \end{array} \right\} \quad (103)$$

$\omega_n$ and $\alpha_n$ are expressed in terms of Xn, Yn, Zn, as follows:

$$\left. \begin{array}{l} \omega_n = \mathrm{Tan}^{-1}\left(\dfrac{Yn}{Xn}\right) \\ \alpha_n = \mathrm{Tan}^{-1}\left(\dfrac{Zn}{\sqrt{Xn^2 + Yn^2}}\right) \end{array} \right\} \quad (104)$$

This may be rewritten by the use of the expressions directly used in the above-mentioned equations (102) and (103), as follows:

$$\cos\alpha_n = \sqrt{X^2 + Y^2} \quad (105)$$

-continued
$$\sin \alpha_n = Zn$$
$$\cos(\omega_n - \theta_{2n-1}) = \frac{1}{\sqrt{X_n^2 + Y_n^2}} (Xn \cos \theta_{2n-1} + Yn \sin \theta_{2n-1})$$
$$\sin(\omega_n - \theta_{2n-1}) = \frac{1}{\sqrt{X_n^2 + Y_n^2}} (Yn \cos \theta_{2n-1} - Xn \sin \theta_{2n-1})$$

Thus, by the use of equation (102), (103) and (105), the direction cosine $\vec{X}'n = (X'n, Y'n, Z'n)$ of the emergent beam shown in equation (101) may be expressed in terms of the direction cosine $\vec{X}'n = (X'n, Y'n, Z'n)$ of the incident beam, the inclinations $\theta_{2n-1}$ and $\theta_{2n}$ of the prism surfaces, the refractive indices $N_{2n-1}$, $N'_{2n-1}$ and $N'_{2n}$ of the prism and its adjacent mediums, and the foregoing parameters $\omega_n$ and $\alpha_n$ of the incident beam.

The planarity of the beam emergent from the nth prism will now be considered. As regards the planarity, the (H) defined in connection with the above-mentioned single prism is intactly applicable to the ray emergent from the nth prism. Thus, the amount sin (H) n which represents the planarity of the ray emergent from the nth prism is expressed as:

$$\sin \text{(H)} n = (\frac{N'_{2n-1}}{N'_{2n}}) \{ \eta_{2n} \cdot \xi'_{2n,p} - \eta_{2n,p} \xi'_{2n} \} \quad (106)$$

However, as already noted, the suffix p replates to the principal ray and thus, $$\left. \begin{array}{l} \xi'_{2n,p} = (\xi'_{2n}) \alpha_1 = 0 \\ \eta_{2n,p} = (\eta_{2n}) \alpha_1 = 0 \end{array} \right\} \quad (107)$$

Since the condition for planarity is sin (H) = 0, the condition for the planarity of the beam emergent from the nth prism is;

$$\eta_{2n} \xi'_{2n,p} - \eta_{2n,p} \xi'_{2n} = 0 \quad (108)$$

Since it has been found that a single prism is not sufficient to maintain planarity, study will now be made of the planarity as provided when two prisms are used. First, if the structural amounts $\theta_1$, $\Delta\theta_1$, $N'_1$ of the first prism are given, the direction cosine $\vec{X}'_1$ of the beam emergent from the first prism, namely, the direction cosine $\vec{X}_2$ of the beam incident on the second prism, may be known. In other words, the parameters $\omega_2$ and $\alpha_2$ of the beam incident on the second prism may be known. The condition for the planarity of the beam emergent from the second prism is:

$$\eta_4 \xi'_{4,p} - \eta_{4,p} \xi'_4 = 0 \quad (109)$$

From equation (102), $\eta_4$ and $\xi'_4$ may be given as follows:

$$\eta_4 = \frac{N_3}{N'_3} \cos \alpha_2 \sin (\omega_2 - \theta_3) \cos \Delta\theta_2 - \xi'_3 \sin \Delta\theta_2 \quad (110)$$

$$\xi'_4 = \sqrt{1 - (\frac{N_3}{N_4})^2 (1 - \xi_4^2)}$$

However, $$\xi_4 = \frac{N_3}{N'_3} \cos \alpha_2 \sin (\omega_2 - \theta_3) \sin \Delta\theta_2 + \xi'_3 \cos \Delta\theta_2 \quad (111)$$

-continued $$\xi'_3 = \sqrt{1 - (\frac{N_3}{N'_3})^2 (1 - \xi_3)}$$

$$\xi_3 = \cos(\omega_2 - \theta_3) \cos \alpha_2$$

Also, $\eta_{4,p}$ and $\xi'_{4,p}$ relate to the beam which occupies $\alpha_1 = 0$ of the beam incident on the first prism (namely, the principal beam), and if the parameters relating to the direction cosine of the principal beam incident on the second prism are $\omega_{2p}$ and $\alpha_{2p}$, $\eta_{4,p}$ and $\xi'_{4,p}$ may be expressed as:

$$\eta_{4,p} = \frac{N_3}{n'_3} \cos\alpha_{2,p} \sin(\omega_{2,p} - \theta_3) \cos\Delta\theta_2 - \xi'_{3,p} \sin\Delta\theta_2 \quad (112)$$

$$\xi'_{4,p} = \sqrt{1 - (\frac{N_3}{N_4})^2 (1 - \xi_{4,p}^2)}$$

However, $$\zeta_{4,p} = \frac{N_3}{N'_3} \cos \alpha_{2,p} \sin(\omega_{2,p} - \theta_3) \sin\Delta\theta_2 + \zeta'_{3,p} \cos\Delta\theta_2 \quad (113)$$

$$\zeta'_{3,p} = \sqrt{1 - (\frac{N_3}{N'_3})^2 (1 - \zeta_{3,p}^2)}$$

$$\zeta_{3,p} = \cos(\omega_{2,p} - \theta_3) \cos\alpha_{2,p}$$

By substituting equations (110) and (112) for equation (109) and using equations (111) and (113) therewith, it is possible to find out a solution which determines the inclination $\theta_3$ of the incidence surface and the vertical angle $\Delta\theta_2$ which are the unknown structural amounts of the second prism. However, it is to be understood that the refractive index $N_3'$ of the second prism and the refractive indices $N_3$ and $N_4'$ of its adjacent mediums are predetermined.

Nevertheless, it is very cumbersome to find out the unknown amounts by the above-descried process. Therefore, instead of directly solving the equation (109), it may be resorted to as a technique of design to substitute arbitrary values of $\theta_3$ and $\Delta\theta_2$ for equation (109) with the two unknown structural amounts $\theta_3$ and $\Delta\theta_2$ used as parameters and to find out the values of $\theta_3$ and $\Delta\theta_2$ by the rule of trial and error. This process would readily be possible to any person skilled in the art by the use of a computer. If the solutions obtained prove to be inappropriate in practice, the structural amounts of the first prism may be suitably varied and the above-mentioned process may be repeated, thereby obtaining optimal values.

It has already been noted that the above-described planarity is important in the prism anamorphic optical system used for the scanning optical system. In the scanning optical system, it is further desired that the direction cosine of the principal ray of the scanning beam incident on the prism anamorphic optical system and the direction cosine of the principal ray emergent from such optical system be in the same direction to effect alignment or the like of the optical system. This will hereinafter be referred to as the parallelism of the prism system. The parallelism of the prism anamorphic optical system will now be analysed in the same manner as was the planarity.

Consider an afocal anamorphic prism optical system which comprises R prisms. Let $\vec{X}_{1,p}$ be the direction cosine of the principal ray of the scanning beam incident on the first prism and $\vec{X}_{R,p}$ be the direction cosine of the principal ray emergent from the Rth prism. Then, the condition for the parallelism is:

$$| \vec{X}_{1,p} \vec{X}'_{R,p} | = 0 \quad (114)$$

Components of each direction cosine are:

$$\vec{X}_{1,p} \equiv (X_{1,p}, Y_{1,p}, 0) \quad (115)$$

$$\vec{X}_{R,p} \equiv (X_{R,p}, Y_{R,p}, 0)$$

Hence, the conditional equation (114) may be expressed as: $X_{1,p} \cdot Y'_{R,p} - Y_{1,p} \cdot X'_{R,p} = 0 \quad (116)$ If $X_{1,p} = \cos\omega$ and $Y_{1,p} = \sin\omega$ are taken into account, the following will be obtained as the condition for parallelism:

$$Y'_{R,p} \cos\omega - X'_{R,p} \sin\omega = 0 \quad (117)$$

If this condition (117) is satisfied, there is provided the parallelism. Thus, a deflected beam which will satisfy both the planarity and the parallelism will be provided by a prism afocal anamorphic optical system which will satisfy both the condition (108) for the planarity and the condition (117) for the parallelism.

However, it is theoretically difficult to obtain a solution which will satisfy both the condition (108) and the condition (117). Therefore, by the rule of trial and error similar to that in the aforementioned process of design for the planarity, we have succeeded in obtaining a prism afocal anamorphic optical system which can provide a deflected beam satisfying both the planarity and the parallelism.

In this process of design, it has been very difficult to obtain a prism afocal anamorphic optical system comprising two prisms which satisfies both the planarity and the parallelism. However, it has been relatively easy to obtain a prism afocal anamorphic optical system comrising three prisms.

Figure 5:
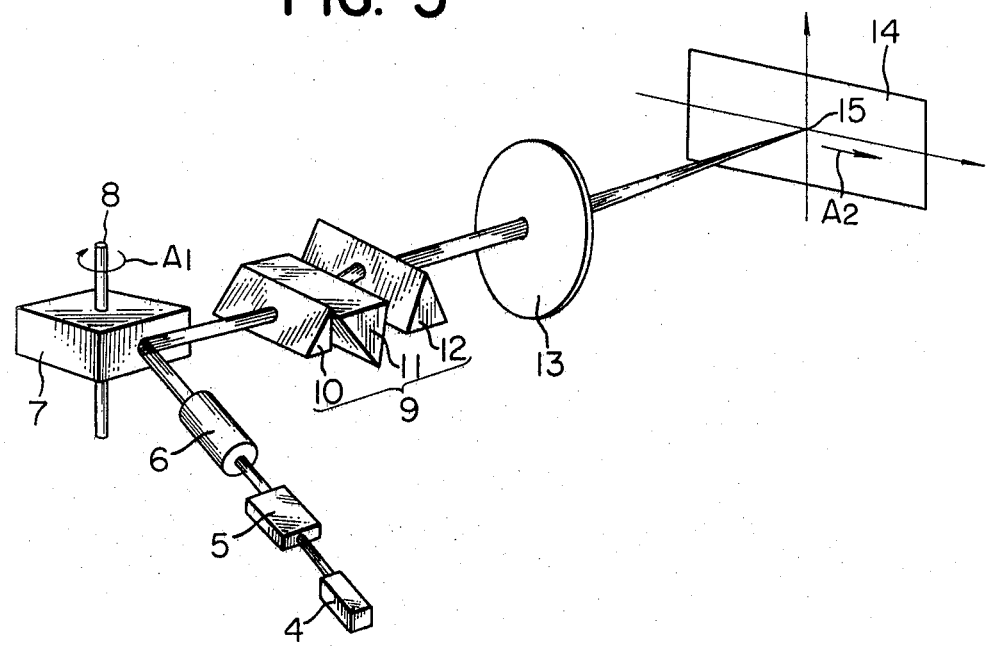
FIG. 5 schematically shows an embodiment of the device according to the present invention.

FIG. 5 shows, in perspective view, an embodiment in which the light beam scanning device of the present invention is used for a writing optical system such as a laser beam printer or the like. In FIG. 5, there is seen a light source 4 such as laser or the like, a modulator 5 for imparting writing signals to the laser beam, and a beam expander 6 for expanding the diameter of the beam from the modulator. A rotatable polygonal mirror 7 is securely mounted on a rotatable shaft 8 rotatable by unshown rotating means. An afocal anamorphic optical system 9 comprising three prisms is provided to expand the components of the beam in a direction to correct the "tilt" of the rotatable mirror 7. Designated by 13 is a condenser lens for condensing the beam onto a surface to be scanned 14. Thus, the beam from the light source 4 may be modulated by the modulator 5 and passed through the beam expander 6 to form a parallel or substantially parallel beam which is incident on a surface of the rotatable mirror 7 which is scanning means.

The parallel or substantially parallel beam from the rotatable mirror may be focused as a spot 15 on the scanned surface by the condensing optical system 9, 13. Therefore, rotation of the rotatable shaft 8 in the direction of arrow $A_1$ will cause the scanning spot 15 to move on the scanned surface 14 in the direction of arrow $A_2$.

Figure 6:
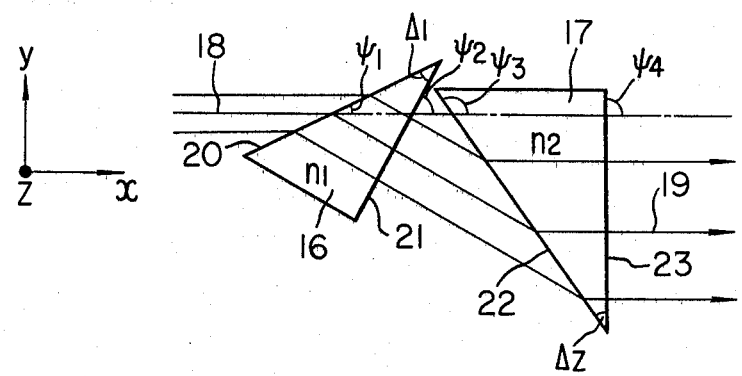
FIG. 6 illustrates the prism anamorphic optical system used in the device of the present invention.

FIG. 6 is a front cross-sectional view of a prism anamorphic optical system comprising a combination of two prisms 16 and 17. The surfaces 20, 21, 22 and 23 of the prism through which the beam passes are perpendicular planes to the x-y plane and the beam is scanned along the z-axis. The angle formed between the beam incident on the prism and the respective surfaces of the prisms are $\phi_1$, $\phi_2$, $\phi_3$ and $\phi_4$. The relation of $\phi$ with the aforementioned $\theta$ is that $\phi = 90 + \theta$.

Examples of the prism according to the present invention will now be shown. The examples shown below comprise two and three prisms, respectively. This is because, when a prism optical system is put into use, it is usually desirable that the optical system be designed so as to provide parallelism between the incident and the emergent light beam, in addition to the planarity of the emergent light beam which is the task of the present invention. Usually, with an optical system comprising two prisms, it is practically difficult to satisfy both the planarity of the emergent beam and the parallelism of the emergent beam to the incident beam. For this reason, one more prism may be added so that both the planarity and the parallelism may be satisfied by the use of the three prisms. Of the following embodiments, the embodiments using two prisms attach importance to the planarity and the embodiments using three prisms are designed such that both the planarity and the parallelism are satisfied.

The data in the following Examples 1 to 9 are those in the where two prisms are employed, and $\phi_1$, $\phi_2$, $\phi_3$, $\phi_4$, $n_1$, $n_2$, $\Delta_1$ and $\Delta_2$ are taken in the same manner as shown in FIG. 6. The emergence characteristics provided by the optical systems of Examples 1 to 9 are illustrated in FIGS. 8 to 16, respectively. In these Figures, $\alpha$ denotes the principal flux incident on the first surface of the prism system as shown in FIG. 2, that is, $\alpha$ in FIG. 6 is the angle formed between the beam incident on the surface 20 of the prism 16 perpendicularly to the z-axis and an arbitrary incident beam. U′k is the angle formed between the beam 18 (FIG. 6) incident on the prism system and the beam 19 emergent from the prism system, namely, the angle formed between the principal ray in the beam incident on the prism system and the principal ray in the beam emergent from the prism system. In this instance, U′k= 0 signifies that the incident and the emergent beam are parallel to each other. Also, $\Delta$ U′k is the angle formed between a plane formed by the principal ray of the emergent beam and the z-axis (this plane is a standard deflection plane) within the scanning angle $\alpha$ and the actual emergent beam, and corresponds to the ⑪ shown in FIG. 4.

Thus, the aforementioned U′k represents the parallelism of the beam and the $\Delta$U′k represents the planarity of the emergent beam. Such significances of the angles $\alpha$, U′k and $\Delta$U′k also hold true in the ensuing embodiments of the present invention, $\beta$ represents the enlargement magnification of the expanded beam.

|  | Ex. 1 (FIG.8) | Ex. 2 (FIG.9) | Ex. 3 (FIG.10) | Ex. 4 (FIG.11) | Ex. 5 (FIG.12) |
| --- | --- | --- | --- | --- | --- |
| $\phi_1$ | 3.7392 | 3.7391 | 3.7391 | 3.8296 | 3.8274 |
| $\phi_2$ | 4.6804 | 4.8145 | 5.1137 | 4.8144 | 4.8144 |
| $\phi_3$ | 126.7561 | 126.7666 | 126.7898 | 126.7665 | 126.7665 |
| $\phi_4$ | 123.7889 | 123.7889 | 123.7889 | 123.2359 | 122.0020 |

-continued

|  | Ex. 1 (FIG.8) | Ex. 2 (FIG.9) | Ex. 3 (FIG.10) | Ex. 4 (FIG.11) | Ex. 5 (FIG.12) |
| --- | --- | --- | --- | --- | --- |
| $\Delta_1$ | 0.9412 | 1.0754 | 1.3746 | 0.9848 | 0.987 |
| $\Delta_2$ | −2.9672 | −2.9777 | −3.0009 | −3.5306 | −4.7645 |
| $n_1$ | 1.91411 | 1.74967 | 1.51462 | 1.91411 | .91411 |
| $n_2$ | 1.91411 | 1.91411 | 1.91411 | 1.74967 | 1.51462 |
| $(n_1-1)\Delta_1$ | 0.86 | 0.81 | 0.71 | 0.90 | 0.90 |
| $(n_2-1)\Delta_2$ | −2.71 | −2.72 | −2.74 | −2.65 | −2.45 |

|  | Example 6 (FIG.13) | Example 7 (FIG.14) | Example 8 (FIG.15) | Example 9 (FIG.16) |
| --- | --- | --- | --- | --- |
| $\phi_1$ | 3.7404 | 3.5612 | 3.7360 | 3.5640 |
| $\phi_2$ | 4.8144 | 4.8144 | 4.8144 | 4.8144 |
| $\phi_3$ | 127.2291 | 127.1319 | 126.7665 | 128.1828 |
| $\phi_4$ | 123.7889 | 123.7889 | 122.0733 | 123.7889 |
| $\Delta_1$ | 1.074 | 1.2532 | 1.0784 | 1.2504 |
| $\Delta_2$ | −3.4402 | −3.343 | −4.6932 | −4.3939 |
| $n_1$ | 1.74967 | 1.51462 | 1.74967 | 1.51462 |
| $n_2$ | 1.74967 | 1.74967 | 1.51462 | 1.51462 |
| $(n_1-1)\Delta_1$ | 0.81 | 0.64 | 0.81 | 0.64 |
| $(n_2-1)\Delta_2$ | −2.58 | −2.51 | −2.42 | −2.26 |

The refractive indices $n_1$ and $n_2$ of the prisms are for the wavelength 6328A, and $(n-1)\Delta$ indicates the power of each prism. The vertical angles $\Delta_1$ and $\Delta_2$ of the prsims are calculated as $\Delta_1 = \theta_2 - \theta_1$ and $\Delta_2 = \theta_4 - \theta_3$, respectively, and therefore, in this case, the power of the prism whose vertical angle downwardly faces is negative.

FIG. 17 shows a prism optical system comprising three prisms, and the setting of the surfaces of each prism and setting of the parameters are done in the same manner as shown in FIG. 6. The only difference of this embodiment from the FIG. 6 embodiment is that a prism 26 is added and the total number of the prisms used is three. The data in Examples 10 to 19 which employ three prisms will be shown below. The refractive indices $n_1$, $n_2$ and $n_3$ of the respective prisms are the values for the wavelength 6328A. The emergence characteristics corresponding to Examples 10 to 19 are shown in FIGS. 18 to 27.

|  | Example 10 (FIG.18) | Example 11 (FIG.19) | Example 12 (FIG.20) | Example 13 (FIG.21) | Example 14 (FIG.22) |
| --- | --- | --- | --- | --- | --- |
| $\phi_1$ | 42.1720 | 43.4858 | 41.2085 | 45.0961 | 42.6629 |
| $\phi_2$ | 75.0241 | 78.1044 | 80.7010 | 83.6376 | 77.8454 |
| $\phi_3$ | 137.0759 | 137.0730 | 136.5875 | 143.0296 | 140.8414 |
| $\phi_4$ | 104.2346 | 105.6315 | 107.6040 | 117.3176 | 113.2971 |
| $\phi_5$ | 67.0758 | 66.9652 | 66.7529 | 70.0085 | 70.1007 |
| $\phi_6$ | 97.8326 | 96.6674 | 95.1253 | 97.2433 | 97.2433 |
| $\Delta_1$ | 32.8521 | 34.6186 | 39.4925 | 38.5415 | 35.1825 |
| $\Delta_2$ | −32.8413 | −31.4415 | −28.9835 | −25.7120 | −27.5443 |
| $\Delta_3$ | 30.7568 | 29.7022 | 28.3724 | 27.2348 | 27.1426 |
| $n_1$ | 1.60102 | 1.60102 | 1.51462 | 1.46920 | 1.51462 |
| $n_2$ | 1.83958 | 1.83958 | 1.91411 | 1.74967 | 1.79883 |
| $n_3$ | 1.51462 | 1.51462 | 1.51462 | 1.46920 | 1.51462 |
| $(n_1-1)\Delta_1$ | 19.74 | 20.81 | 20.32 | 18.08 | 18.11 |
| $(n_2-1)\Delta_2$ | −32.00 | −30.60 | −28.07 | −24.96 | −26.75 |
| $(n_3-1)\Delta_3$ | 15.83 | 15.29 | 14.60 | 12.78 | 13.97 |

|  | Example 15 (FIG.23) | Example 16 (FIG.24) | Example 17 (FIG.25) | Example 18 (FIG.26) | Example 19 (FIG.27) |
| --- | --- | --- | --- | --- | --- |
| $\phi_1$ | 41.3656 | 45.3900 | 51.9933 | 41.7235 | 55.5909 |
| $\phi_2$ | 76.5332 | 82.2743 | 87.5356 | 79.2651 | 84.9739 |
| $\phi_3$ | 140.0217 | 141.1690 | 144.9374 | 141.4557 | 146.5360 |
| $\phi_4$ | 113.2971 | 110.6284 | 110.6284 | 113.4157 | 114.5877 |
| $\phi_5$ | 70.1643 | 69.0062 | 69.0489 | 68.8639 | 72.5476 |
| $\phi_6$ | 97.2433 | 97.2433 | 97.2433 | 97.2433 | 97.2433 |
| $\Delta_1$ | 35.1676 | 36.8753 | 35.5423 | 37.5416 | 29.583 |
| $\Delta_2$ | −26.7246 | −30.5406 | −34.309 | −28.04 | −31.9483 |
| $\Delta_3$ | 27.079 | 28.2371 | 28.1944 | 28.3794 | 24.6957 |
| $n_1$ | 1.51462 | 1.51462 | 1.51462 | 1.46920 | 1.60017 |
| $n_2$ | 1.83958 | 1.74967 | 1.60017 | 1.74967 | 1.60017 |
| $n_3$ | 1.51462 | 1.51462 | 1.51462 | 1.46920 | 1.60017 |
| $(n_1-1)\Delta_1$ | 18.10 | 1.98 | 18.29 | 17.61 | 17.75 |
| $(n_2-1)\Delta_2$ | −25.89 | −29.79 | −33.71 | −27.29 | −19.17 |
| $(n_3-1)\Delta_3$ | 13.94 | 14.53 | 14.51 | 13.32 | 14.82 |

In the foregoing examples, anamorphic afocal prism systems comprising two and three prisms, respectively, have been shown, but it is of course possible to employ four or more prisms. However, a greater number of prisms means a greater number of factors which affect the planarity of the beams between the prisms, so that design will be more difficult and the cost will be increased.

According to the present invention, as described above, in order to correct the positional error of the scanning beam resulting from the "tilt" of light scanning means such as rotatable mirror or vibratory mirror, a parallel or substantially parallel beam is caused to be incident on the light scanning means for reflection therefrom, and as an afocal anamorphic optical system a prism optical system comprising a plurality of prisms each having at least one vertical angle differing from the other vertical angles is disposed in the condensing optical system provided between the light scanning means and the scanned surface, whereby the parallel or substantially parallel beam from the light scanning means may have its diameter expanded in the direction to correct said "tilt". Thus, the present invention can correct the "tilt" of the light scanning means with high accuracy by a simple means which comprises a combination of prisms.

What we claim is:

1. A light beam scanning device comprising:
 a source of light;
 a deflecting mirror for causing a light beam from said source to be deflected about an axis toward which said light beam is directed;
 a prism anamorphic afocal optical system for the correction of tilt disposed in the path of the deflected beam from said deflecting mirror, said prism anamorphic afocal optical system comprising a plurality of prisms so that different displacements of the deflected beam at each angle of deflection and in a direction perpendicular to the direction of deflection caused by the first of said prisms are corrected by the second and subsequent prisms, as viewed from the incidence side; and
 a condensing optical system disposed between said prism anamorphic afocal system and a surface to be scanned, to thereby cause the deflected beam from said prism anamorphic afocal optical system to be condensed on said surface to be scanned.

2. A device according to claim 1, wherein said prism anamorphic afocal optical system is designed such that the angle formed between the standard deflection plane of the deflected beam emergent from said prism anamorphic afocal optical system and the actual deflected beam is 0.00997 or less.

3. A device according to claim 1, wherein said prism anamorphic afocal optical system is designed such that the angle formed between the principal ray in the deflected beam incident on said prism anamorphic afocal optical system and the principal flux in the deflected beam emergent from said prism anamorphic afocal optical system is 0.051 or less.

* * * * *

UNITED STATES PATENT AND TRADEMARK OFFICE
CERTIFICATE OF CORRECTION

PATENT NO. : 4,084,881  Page 1 of 2
DATED : April 18, 1978
INVENTOR(S) : Yoichi Hirabayashi, et al.

It is certified that error appears in the above–identified patent and that said Letters Patent are hereby corrected as shown below:

On Title page, after line preceded by [22], insert
--[30]  Foreign Application Priority Data:
        Japanese Application No. 126612/75 filed 10/21/75
        Japanese Application No. 121735/76 filed 10/8/76--

| COL. | LINE | |
|---|---|---|
| 3 | 24 | "angle" should be deleted |
| 3 | 26 | "agle" should read --angle--. |
| 4 | 54 | "$=\vec{(X, Y, Z)}$" should read --$\vec{X} = (X, Y, Z)$-- |
| 5 | 51 | "(2)," should read --flux-- |
| 6 | 3 | "(4)" should read --Thus-- |
| 6 | 9 | Insert --where-- outside bracket. |
| 6 | 11 | "$\Delta$", first occurance, should read --$\alpha$-- |

UNITED STATES PATENT AND TRADEMARK OFFICE
CERTIFICATE OF CORRECTION

PATENT NO. : 4,084,881

DATED : April 18, 1978

INVENTOR(S) : Yoichi Hirabayashi, et al.

It is certified that error appears in the above-identified patent and that said Letters Patent are hereby corrected as shown below:

| COL. | LINE | |
|---|---|---|
| 8 | 37, 38 & 39 | correct to read as follows: $$\eta_{2n} = \frac{N_{2n-1}}{N'_{2n-1}} \cos \alpha_n \sin(\omega_n - \Theta_{2n-1}) \cos \Delta\Theta_n - \xi'_{2n-1} \sin \Delta\Theta_n$$ $$\xi'_{2n} = \sqrt{1 - \left(\frac{N'_{2n-1}}{N'_{2n}}\right)(1 - \xi^2_{2n})}$$ |
| 13 | 6 | ".91411" should read --1.91411-- |
| 13 | 63 | "55.5909" should read --55.3909-- |

Signed and Sealed this

Eighth Day of May 1979

[SEAL]

Attest:

RUTH C. MASON
Attesting Officer

DONALD W. BANNER
Commissioner of Patents and Trademarks